(12) United States Patent
Blanco-Rivera et al.

(10) Patent No.: US 7,055,212 B2
(45) Date of Patent: Jun. 6, 2006

(54) CLEAN GAS INJECTOR SYSTEM FOR REACTOR CHAMBER

(75) Inventors: Ignacio Blanco-Rivera, Allen, TX (US); Nathan J. Kruse, McKinney, TX (US); Sarah Hartwig, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 493 days.

(21) Appl. No.: 10/278,791

(22) Filed: Oct. 24, 2002

(65) Prior Publication Data

US 2004/0127059 A1 Jul. 1, 2004

(51) Int. Cl.
*A47L 5/38* (2006.01)

(52) U.S. Cl. .......................... 15/345; 15/301; 156/916; 156/345.33

(58) Field of Classification Search ................. 15/345, 15/301; 156/916, 345.33; 239/551, 553.5, 239/565
See application file for complete search history.

(56) References Cited

U.S. PATENT DOCUMENTS

| | | | | |
|---|---|---|---|---|
| 1,044,131 | A * | 11/1912 | Brown | 239/565 |
| 2,755,773 | A * | 7/1956 | Haynie | 451/445 |
| 6,368,405 | B1 * | 4/2002 | Shin | 117/93 |
| 6,432,259 | B1 * | 8/2002 | Noorbakhsh et al. | 156/345.33 |
| 6,460,482 | B1 * | 10/2002 | Kuibira et al. | 118/723 R |
| 6,486,081 | B1 * | 11/2002 | Ishikawa et al. | 438/788 |
| 6,755,934 | B1 * | 6/2004 | Matsuoka | 156/345.33 |
| 6,837,967 | B1 * | 1/2005 | Berman et al. | 156/345.33 |
| 2002/0195124 | A1 * | 12/2002 | Chin et al. | 134/18 |
| 2003/0015291 | A1 * | 1/2003 | Lee et al. | 156/345.33 |

* cited by examiner

*Primary Examiner*—Theresa T. Snider
(74) *Attorney, Agent, or Firm*—W. James Brady, III; Frederick J. Telecky, Jr.

(57) ABSTRACT

An improvement to a Novellus HDP SPEED reactor chamber is described. An evacuation port of the Novellus SPEED Chamber is at one location in the chamber to remove injected cleaning gas from the chamber and there is a single input for cleaning gas connection into the chamber. In accordance an improvement a plurality of clean gas injectors is positioned on an adapter in the chamber and connected to the single input gas connection for distributing the cleaning gas in the chamber with the injectors spaced away from the evacuation port. The adapter is a U-shaped adapter and is positioned in the chamber with the adapter connected at the base to the single input gas connection. The adapter has two semicircular branch legs extending in opposite directions about the chamber to free ends that are connected to gas injectors. The free ends with the injectors are located in the chamber almost on the opposite end of the chamber from the evacuation port. Each of the two branch legs includes a second injector midway along the branch legs between the free ends and point of the branch to provide four injectors to evenly distribute the clean gas in the chamber.

10 Claims, 1 Drawing Sheet

CLEAN GAS INJECTOR SYSTEM FOR REACTOR CHAMBER

FIELD OF INVENTION

This invention relates to clean gas injector system for a reactor chamber.

BACKGROUND OF INVENTION

The current clean gas injector on a Novellus HDP SPEED Chamber consists of a single injector to deliver the cleaning gasses. The chamber includes a base and a ceramic dome in form of a bell jar and is adapted to receive a semiconductor wafer at one port and is used to deposit fluorinated silicate glass (FSG, a dielectric) on the wafer. It also gets everywhere in the chamber including the inside of the ceramic dome and chamber walls. The system has an in-situ cleaning system that sends NF3 gas through a single clean gas injector to clean the chamber of the FSG.

The chamber and some walls are cleaned unevenly in this Novellas HDP SPEED Chamber system as illustrated in FIG. 1. Referring to the sketch of FIG. 1 the chamber system 10 includes the dome or bell jar over the chamber base 11. The wafer sits on an electrostatic chuck (ESC) and is held down via electrostatic forces that act on the wafer. A single injector 13 enters the base 11 of the chamber 10 at the same end as the vacuum pump port 15. The cleaning gas flows through the injector and flows into the dome as illustrated by arrow 16. The vacuum port 15 is at the same end of the chamber 10 as the injector 13. The flow of the gas is illustrated by arrow 16. The flow is up from the injector 13 opening into the dome 12 an evacuated down through the vacuum port 15. The gas flow is mostly in the direction of the arrow 16 so that the clean gas flow is mostly on the injector and the vacuum end of the chamber 10. The result is an uneven cleaning rate of the reactor chamber 10 including base and chamber walls including the dome. The uneven rate of cleaning causes buildup of aluminum fluoride in the chamber and presents particle problem for deposition. It also results in over etching on the reactor and dome walls near the injector end. It is desirable to improve the in-situ cleaning of the Novellus HDP SPEED Chamber and similar chambers.

Novellus has developed a system that is called "Toggle Clean." Toggle Clean has two injector that enter the reactor from orifices in the floor of reactor. The purpose of these injectors is to alternate gas flow through them so that deposition in the injector tubes is cleaned. The new design flow gasses through multiple (3+) clean injectors simultaneously, providing more uniform gas flow and allowing a more robust clean.

SUMMARY OF INVENTION

In accordance with one embodiment of the present invention an improved clean gas system includes providing in the chamber an injector at a location remote from the evacuation port.

In accordance with another embodiment of the present invention clean gasses are distributed more evenly throughout the chamber by multiple clean injectors distributed around the chamber and away from the evacuation port.

DESCRIPTION OF PREFERRED EMBODIMENTS

Figure 1:
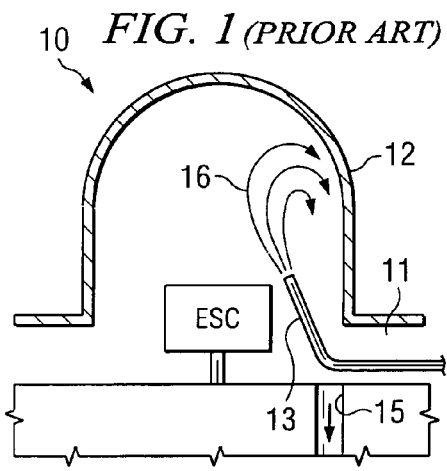
FIG. 1 illustrates a prior art Novellus system with a single injector.
Figure 2:
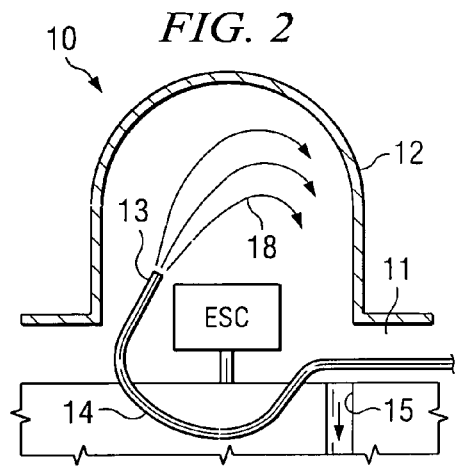
FIG. 2 illustrates a first embodiment of the present invention using one injector remote from the exhaust port.

In accordance with one embodiment of the present invention as illustrated in FIG. 2 the Novellus HDP SPEED Chamber flow is improved by moving the injector 13 to the end opposite the evacuation port 15 using a curved extender pipe adapter 14 extending the line from the current injector port 13 to the evacuation port at other end of chamber 10. The flow is more parabolic as illustrated by arrow 18 providing more uniform cleaning. The extender pipe adapter 14 extends around the inner base of the chamber 10 to the opposite end of the chamber 10.

The directly opposite end of the chamber from the original position of the injector port 13 and evacuation port 15 in the Novellus HDP SPEED chamber is the access port to receive the wafer to be processed into the chamber so the placement of the injector 13 and extender pipe adapter 14 is not such that the injector is on the directly opposite end of the chamber from the evacuation port 15. Since the directly opposite end is not free to easily put the injector 13 a dual injector system is used to more evenly distribute the cleaning gas.

Figure 3:
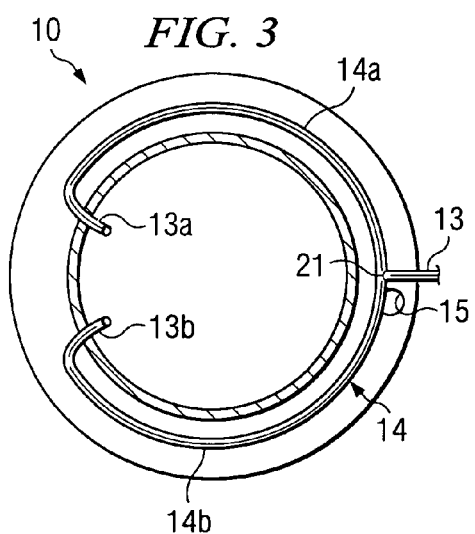
FIG. 3 illustrates a second embodiment of the present invention using two injectors.

Referring to FIG. 3 there is illustrated a dual injector system in chamber 10 according to a second embodiment of the present invention. Two injectors 13a and 13b are connected at the free ends of a U-shaped manifold adapter 14. The two injectors 13a and 13b are placed on either side of the wafer access port. The U-shaped manifold adapter 14 is connected at the base 21 to the original input injector port 13 of the single injector and at the free ends of branch legs 14a and 14b to the injectors 13a and 13b. The injectors 13a and 13b are by the adapter 14 placed on the opposite end of the chamber 10 from the evacuation port 15 located near the base 21 where the adapter 14 branches off by branch legs 14a and 14b to the injectors 13a and 13b.

Figure 4:
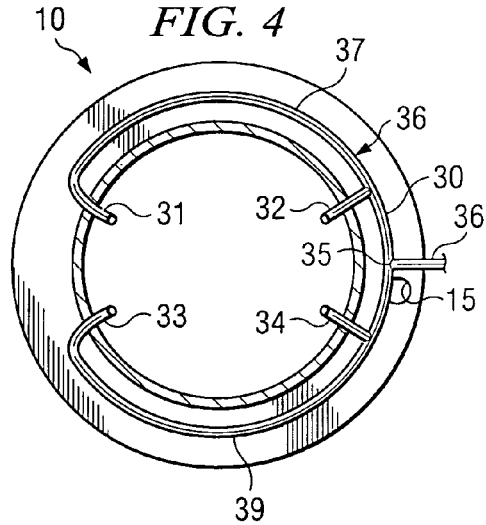
FIG. 4 illustrates a third embodiment of the present invention using four injectors.
Figure 5:
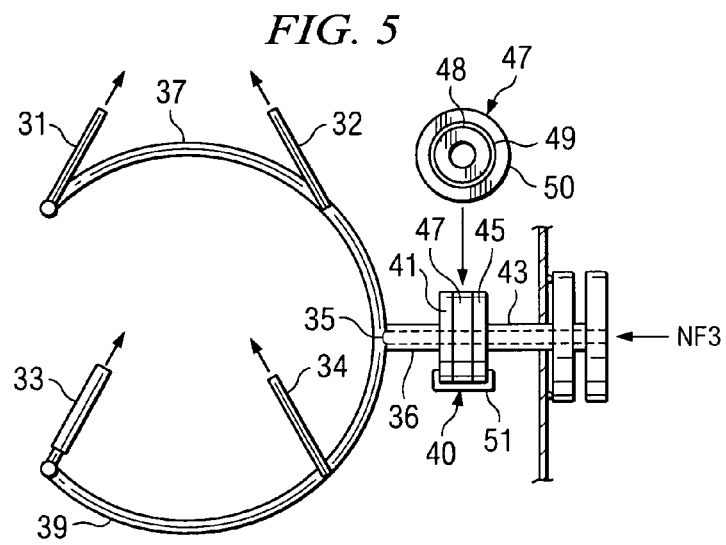
FIG. 5 illustrates the manifold adapter of FIG. 4 and the connection of the adapter to the Novellus clean gas supply.

Referring to FIGS. 4 and 5 there is illustrated an improved system with four injectors that is the preferred embodiment of the present invention and provides the most even cleaning. In this embodiment the there are four injectors 31–34 equally distributed about the chamber 10 to provide more uniform gas flow with a gap at the wafer access port. The injectors 31–34 are fed gas from the single clean gas input port that is connected to the base 35 of a U-shaped manifold adapter 30 that branches into two semicircular tubes or branch legs 37 and 39 at the base 35. The adapter 30 has a first branch leg 37 with an end injector 31 at the free end of branch leg 37 and has a midpoint injector 32 located midway along the branch leg 37 between end injector 31 and branch leg 37 connection at the base 35. The second branch leg 39 has at the free end the injector 33 and has a midpoint injector 34 located midway along branch leg 39 between the end injector 33 and the branch leg input connection at the base 35. The gas injectors 31–34 are pointed up 60 degrees from the horizontal pointing to the center of the circle. The injector and adapter are made of thicker high grade aluminum than that outside the chamber to overcome heat in the chamber. The injectors 31–34 are ¼ outside diameter and ⅛ inside diameter. The adapter 30 is made ½ outside and ¼ inside diameter.

At the U-shaped manifold adapter branching point base 35 of the adapter 30 is a connecting section of pipe 36 that extends to a flange 41 as illustrated in FIG. 5. A pipe 43 extends through the Novellus HDP SPEED Chamber wall surface and has a flange 45. A clamped junction 40 is provided using this flange 45 that is connected through the Novellus SPEED Chamber walls and flange 41. The clamped junction 40 includes an O-ring assembly 47 between the flanges 41 and 45 and clamp assembly 51. The O-ring assembly 47 includes an aluminum inner sealing ring 48, a Kalrez™ or Chemraz™ O-ring 49 and a protective aluminum outer pressure ring 50. The outer protective ring 50 protects the Kalrez™ or Chemraz™ O-ring material from the plasma in the chamber. The whole assembly 47 is clamped together using a modified Nor-Cal KF Clamp 51. Kalrez™ is an O-ring material sold under trademark by DuPont and Chemraz™ is an 0-ring material sold under trademark by Green Tweed. The end of pipe 43 is connected to the Novellus SPEED Chamber single clean gas supply which is near the pump evacuation port 15.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

The invention claimed is:

1. An NF3 clean gas system for a reactor chamber having a base and a dome over the base comprising: an evacuation port at one location in the base of the reaction chamber to remove injected NF3 cleaning gas from the reaction chamber and an input port for supplying said NF3 cleaning gas; an injector and an adapter; said injector positioned at a location remote from the evacuation port for injecting the NF3 cleaning gas into the chamber at a desired direction to improve the cleaning of the chamber by said adapter coupled between said injector and said input port; said adapter extending from said input port near said evacuation port alone the base to said injector near the opposite end of the chamber with respect to the evacuation port.

2. A clean gas system for a reactor chamber having a base and a dome over said base comprising:
an evacuation port at one location in the base of the reactor chamber to remove injected cleaning gas from the reactor chamber;
a single input cleaning gas connection extending into said base of said reactor chamber; and
a plurality of distributed cleaning gas injectors and an adapter in said reactor chamber with said injectors connected to said single input gas connection by said adapter extending alone said base of said reactor chamber for distributing the cleaning gas in the reactor chamber with the injectors extending into said chamber from said adapter around said base of said reactor chamber and spaced away from the evacuation port.

3. The clean gas system of claim 2 wherein said plurality is four.

4. The clean gas system of claim 2 wherein said plurality is two.

5. The clean gas system of claim 2 wherein said adapter is a U-shaped adapter located in said reaction chamber with the adapter connected to said single input gas connection and having two branch legs extending in opposite directions about the chamber base to free ends that are connected to two of said gas injectors and the free ends are remote from the evacuation port.

6. The clean gas system of claim 5 wherein each of the two branch legs includes a second injector midway between the free ends and point of the branch to more even distribute the clean gas in the reaction chamber.

7. In a Novellus HDP Speed reactor chamber having a base and a dome over said base and having
an evacuation port at one location in the base of said reaction chamber to remove injected NF3 cleaning gas from the reaction chamber and
a single input NF3 cleaning gas connection into said reactor chamber near said base near said evacuation port; the improvement comprising:
a plurality of NF3 clean gas injectors in said reaction chamber connected to said single input gas connection by an adapter near said base for distributing the cleaning gas in said reaction chamber from a position near the base into said chamber with the injectors spaced away from the evacuation port.

8. The reactor chamber of claim 7 wherein said adapter is a U-shaped adapter located in said reaction chamber with the adapter connected to said single input gas connection and having two semicircular branch legs extending in opposite directions about the reactor chamber near said base to free ends that are connected to two of said gas injectors and the free ends are remote from the evacuation port.

9. The reactor chamber of claim 8 wherein each of the two branch legs includes a second gas injector midway between the free ends and point of the branch to more evenly distribute the clean gas in the reaction chamber.

10. The reactor chamber of claim 7 wherein said plurality is four.

* * * * *